United States Patent
Lee et al.

(10) Patent No.: US 10,233,350 B2
(45) Date of Patent: Mar. 19, 2019

(54) PHOTOCURABLE COMPOSITION AND ENVELOPED DEVICE INCLUDING SAME

(71) Applicant: CHEIL INDUSTRIES INC., Gumi-si, Gyeongsangbuk-do (KR)

(72) Inventors: Chang Min Lee, Uiwang-si (KR); Seung Jib Choi, Uiwang-si (KR); Kyoung Jin Ha, Uiwang-si (KR); Sung Min Ko, Uiwang-si (KR); Ji Hye Kwon, Uiwang-si (KR); Seong Ryong Nam, Uiwang-si (KR); Se Il Oh, Uiwang-si (KR); Yeon Soo Lee, Uiwang-si (KR); Ji Yeon Lee, Uiwang-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 262 days.

(21) Appl. No.: 14/769,845

(22) PCT Filed: Oct. 31, 2013

(86) PCT No.: PCT/KR2013/009784
§ 371 (c)(1),
(2) Date: Aug. 24, 2015

(87) PCT Pub. No.: WO2014/148717
PCT Pub. Date: Sep. 25, 2014

(65) Prior Publication Data
US 2016/0017170 A1    Jan. 21, 2016

(30) Foreign Application Priority Data
Mar. 22, 2013 (KR) .......... 10-2013-0031164

(51) Int. Cl.
| | | |
|---|---|---|
| C09D 133/14 | (2006.01) |
| C08F 230/02 | (2006.01) |
| C08F 230/08 | (2006.01) |
| C08F 222/22 | (2006.01) |
| C09D 135/02 | (2006.01) |
| H01L 23/29 | (2006.01) |
| H01L 51/52 | (2006.01) |

(52) U.S. Cl.
CPC .......... *C09D 133/14* (2013.01); *C08F 222/22* (2013.01); *C08F 230/02* (2013.01); *C08F 230/08* (2013.01); *C09D 135/02* (2013.01); *C08F 2222/225* (2013.01); *H01L 23/293* (2013.01); *H01L 51/5256* (2013.01); *H01L 2251/558* (2013.01); *H01L 2924/0002* (2013.01)

(58) Field of Classification Search
CPC ... C09D 133/14; C09D 135/02; C08F 222/22; C08F 230/02; C08F 230/08
See application file for complete search history.

(56) References Cited

U.S. PATENT DOCUMENTS

| | | |
|---|---|---|
| 7,709,221 B2 | 5/2010 | Rose et al. |
| 2007/0161069 A1 | 7/2007 | Rose et al. |
| 2007/0202270 A1* | 8/2007 | Rose ............. B05D 1/62 427/585 |
| 2011/0232726 A1 | 9/2011 | Aiba |

FOREIGN PATENT DOCUMENTS

| | | |
|---|---|---|
| CN | 101218707 A | 7/2008 |
| JP | 2009-102574 A | 5/2009 |
| JP | 2011-200780 A | 10/2011 |
| KR | 10-2008-0030649 A | 4/2008 |
| KR | 10-2013-0016069 A | 2/2013 |

OTHER PUBLICATIONS

Hoyle, Charles (1990). Radiation Curing of Polymeric Materials. Washington, DC: Am. Chem. Soc. pp. 1-15. (Year: 1990).*
International Search Report for PCT/KR2013/009784 filed Oct. 31, 2013.
Chinese Office action dated Apr. 6, 2016 for Chinese Patent Application No. 201380074988X. (Lee, et al.).

* cited by examiner

Primary Examiner — Sanza L. McClendon
(74) Attorney, Agent, or Firm — Lee & Morse, P.C.

(57) ABSTRACT

The present invention relates to a photocurable composition including (A) a photocurable monomer, (B) a monomer of chemical formula 1 or an oligomer thereof and (C) an initiator, a barrier layer including the same and an enveloped device including the same.

17 Claims, 1 Drawing Sheet

[Fig.1]
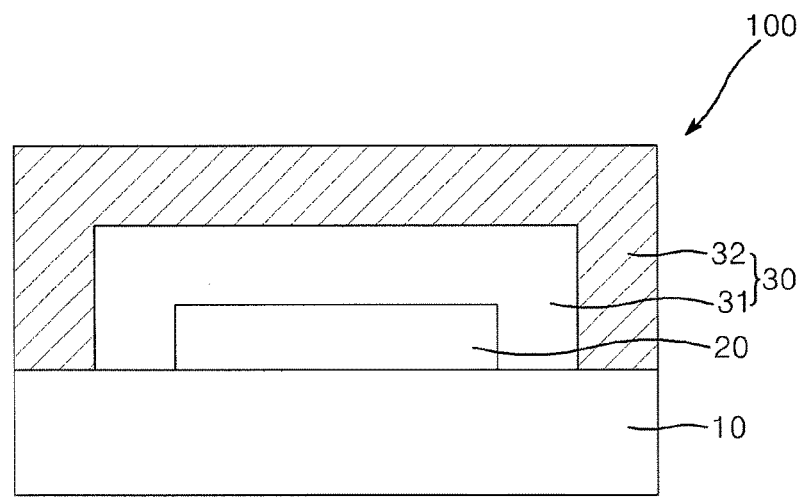
[Fig.2]
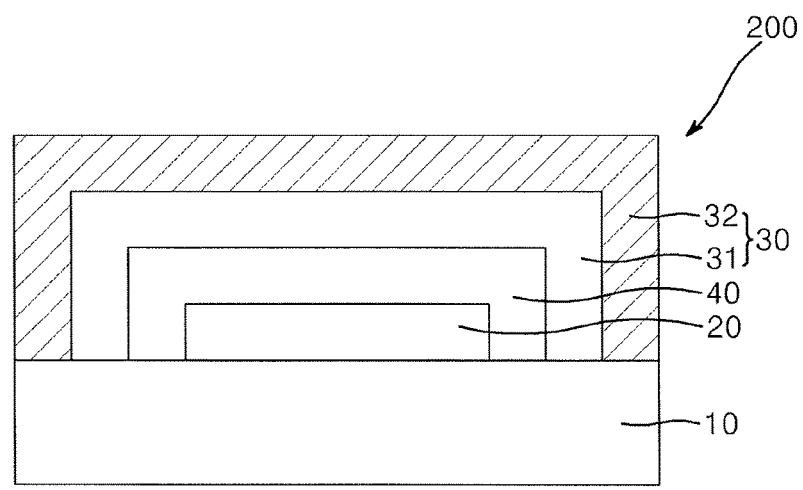

PHOTOCURABLE COMPOSITION AND ENVELOPED DEVICE INCLUDING SAME

CROSS REFERENCE TO RELATED APPLICATIONS

This is the U.S. national phase application based on PCT Application No. PCT/KR2013/009784, filed Oct. 31, 2013, which is based on Korean Patent Application No. 10-2013-0031164, filed Mar. 22, 2013, the entire contents of all of which are hereby incorporated by reference.

TECHNICAL FIELD

The present invention relates to a photocurable composition and an encapsulated apparatus including the same.

BACKGROUND ART

An organic light emitting diode (OLED) has a structure in which a functional organic layer is interposed between a cathode and an anode, and produces highly energetic excitons by recombination of holes injected from the anode with electrons injected from the cathode. Then, the produced excitons are transferred to a ground state to generate light having a specific wavelength. Organic light emitting diodes have advantages of self-luminescence, rapid response, wide viewing angle, high definition, and durability.

However, organic light emitting diodes have problems of deterioration in performance and lifespan due to oxidation of organic materials and/or electrode materials caused by moisture or oxygen from outside or due to internal or external outgassing. To overcome such problems, various methods, such as coating with a photocurable sealing agent, attachment of a transparent or opaque hygroscopic agent, or provision of fits to a substrate having an organic light emitting diode formed thereon, have been proposed in the art.

DISCLOSURE

Technical Problem

It is an aspect of the present invention to a photocurable composition capable of realizing a layer that exhibits significantly lower outgassing, high curing rate, high adhesion to an inorganic barrier layer, and can avoid a shift due to shrinkage stress after curing.

It is another aspect of the present invention to provide a photocurable composition capable of realizing a layer that can extend lifespan of a member for an apparatus encapsulated therewith.

It is a further aspect of the present invention to provide a barrier layer including a cured product of the photocurable composition as set forth above and an encapsulated apparatus including the same.

Technical Solution

In accordance with one aspect of the present invention, a photocurable composition includes: (A) a photocurable monomer, (B) a monomer represented by Formula 1 or an oligomer thereof, and (C) an initiator:

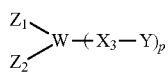

<Formula 1>

(where $Z_1$, $Z_2$, W, $X_3$, Y, and p are the same as defined in the following description).

In accordance with another aspect of the present invention, an encapsulated apparatus may include a member for the apparatus, and a barrier stack formed on the member for the apparatus and including an inorganic barrier layer and an organic barrier layer, wherein the organic barrier layer includes a cured product of the photocurable composition as set forth above.

Advantageous Effects

The present invention provides a photocurable composition that can exhibit significantly lower outgassing and high photocuring rate, and can realize an organic barrier layer exhibiting high adhesion to an inorganic barrier layer to prevent deterioration in performance of a device while extending lifespan of the device when applied to sealing of the device. In addition, the photocurable composition has high photocuring rate and thus avoids a shift when applied to sealing of the device.

DESCRIPTION OF DRAWINGS

FIG. 1 is a sectional view of an encapsulated apparatus according to one embodiment of the present invention.

FIG. 2 is a sectional view of an encapsulated apparatus according to another embodiment of the present invention.

BEST MODE

As used herein, unless otherwise stated, the term "substituted" means that at least one hydrogen atom among functional groups of the present invention is substituted with a halogen atom (F, Cl, Br or I), a hydroxyl group, a nitro group, a cyano group, an imino group (=NH, =NR (R: a $C_1$ to $C_{10}$ alkyl group)), an amino group (—$NH_2$, —NH(R'), —N(R")(R'"), where R', R" and R'" are each independently a $C_1$ to $C_{10}$ alkyl group), an amidino group, a hydrazine or hydrazone group, a carboxyl group, a substituted or unsubstituted $C_1$ to $C_{20}$ alkyl group, a substituted or unsubstituted $C_6$ to $C_{30}$ aryl group, a substituted or unsubstituted $C_3$ to $C_{30}$ cycloalkyl group, a substituted or unsubstituted $C_3$ to $C_{30}$ heteroaryl group, or a substituted or unsubstituted $C_2$ to $C_{30}$ heterocycloalkyl group.

As used herein, the term "hetero" means that a carbon atom is substituted with an atom selected from the group consisting of N, O, S and P.

As used herein, "*" indicates a binding site of an element and the term "(meth)acrylate" may refer to acrylate and/or methacrylate.

A photocurable composition according to the present invention may include (A) a photocurable monomer and (B) a silane group or phosphorus-containing monomer or an oligomer thereof.

(A) Photocurable Monomer

The photocurable monomer may include a non-silicon based monomer that is free from silicon or a non-phosphorus based monomer that is free from phosphorus.

The photocurable monomer may include a photocurable functional group-containing monofunctional monomer, a photocurable functional group-containing polyfunctional monomer, or a mixture thereof. In some embodiments, the photocurable monomer may include a monomer containing about 1 to 30, preferably about 1 to 20, more preferably about 1 to 6 photocurable functional groups. The photocurable functional group may include a substituted or unsubstituted vinyl group, a substituted or unsubstituted acrylate group, or a substituted or unsubstituted methacrylate group.

The photocurable monomer may include a mixture of a monofunctional monomer and a polyfunctional monomer. In the mixture, the monofunctional monomer and the polyfunctional monomer may be present in a weight ratio of about 1:0.1 to about 1:4, preferably about 1:1 to about 1:4, more preferably about 1:2 to about 1:4.

The photocurable monomer may include: $C_6$ to $C_{20}$ aromatic hydrocarbon compounds having a substituted or unsubstituted vinyl group; unsaturated carboxylic acid esters having a $C_1$ to $C_{20}$ alkyl group, a $C_3$ to $C_{20}$ cycloalkyl group, a $C_6$ to $C_{20}$ aromatic group, or a hydroxyl group and a $C_1$ to $C_{20}$ alkyl group; unsaturated carboxylic acid esters having a $C_1$ to $C_{20}$ aminoalkyl group; vinyl esters of $C_1$ to $C_{20}$ saturated or unsaturated carboxylic acids; vinyl cyanide compounds; unsaturated amide compounds; monofunctional or polyfunctional (meth)acrylates of monohydric or polyhydric alcohols, and the like. The term "polyhydric alcohol" refers to alcohols containing two or more, about 2 to 20, preferably about 2 to 10, more preferably about 2 to 6 hydroxyl groups.

Specifically, the photocurable monomer may include: $C_6$ to $C_{20}$ aromatic hydrocarbon compounds having an alkenyl group including a vinyl group, such as styrene, α-methyl styrene, vinyl toluene, vinyl benzyl ether, and vinyl benzyl methyl ether; unsaturated carboxylic acid esters including (meth)acrylic acid esters, such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decanyl (meth)acrylate, undecanyl (meth)acrylate, dodecyl (meth)acrylate, cyclohexyl (meth)acrylate, benzyl (meth)acrylate, phenyl (meth)acrylate, and the like; unsaturated carboxylic acid aminoalkyl esters, such as 2-aminoethyl (meth)acrylate, 2-dimethylaminoethyl (meth)acrylate, and the like; saturated or unsaturated carboxylic acid vinyl esters, such as vinyl acetate, vinyl benzoate, and the like; vinyl cyanide compounds, such as (meth)acrylonitrile; unsaturated amide compounds, such as (meth)acrylamide; and monofunctional or polyfunctional (meth)acrylates of monohydric or polyhydric alcohols, such as ethylene glycol di(meth)acrylate, triethylene glycol di(meth)acrylate, trimethylolpropane tri(meth)acrylate, 1,4-butanediol di(meth) acrylate, 1,6-hexanediol di(meth)acrylate, octyldiol di(meth)acrylate, nonyldiol di(meth)acrylate, decanyldiol di(meth)acrylate, undecanyldiol di(meth)acrylate, dodecyldiol di(meth)acrylate, neopentylglycol di(meth)acrylate, pentaerythritol di(meth)acrylate, pentaerythritol tri(meth) acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta (meth)acrylate, dipentaerythritol hexa(meth)acrylate, bisphenol A di(meth)acrylate, novolac epoxy (meth)acrylate, diethylene glycol di(meth)acrylate, tri(propylene glycol) di(meth)acrylate, poly(propylene glycol) di(meth)acrylate, and the like, without being limited thereto. The term "polyhydric alcohol" refers to alcohols containing two or more, for example, 2 to 20, preferably 2 to 10, more preferably 2 to 6 hydroxyl groups.

In some embodiments, the photocurable monomer may include at least one of $C_1$ to $C_{20}$ alkyl group-containing (meth)acrylates, di(meth)acrylates of $C_2$ to $C_{20}$ diol, tri (meth)acrylates of $C_3$ to $C_{20}$ triol, and tetra(meth)acrylates of $C_4$ to $C_{20}$ tetraol.

The photocurable monomer may be present in an amount of about 1 part by weight to about 99 parts by weight, preferably about 50 parts by weight to about 90 parts by weight, more preferably about 70 parts by weight to about 80 parts by weight, specifically about 70, 71, 72, 73, 74, 75, 76, 77, 78, 79, or 80 parts by weight, based on 100 parts by weight of (A)+(B) in terms of solid content. Within this range, the photocurable monomer can secure high photocuring effects while reducing outgassing and water vapor permeability.

(B) Monomer Containing Phosphorus or Silane Group

The silane group-containing monomer may include a photocurable monomer which includes a silane group and has a photocurable functional group (for example, a (meth) acrylate group, a vinyl group, and the like). In some embodiments, the silane group-containing monomer may include an alkoxy silane monomer that includes silane having at least one alkoxy group bonded thereto.

The phosphorus-containing monomer may include a photocurable monomer which includes phosphorus and has a photocurable functional group (for example, a (meth)acrylate group, a vinyl group, and the like). In some embodiments, the phosphorus-containing monomer may include an alkoxy phosphate monomer including phosphorus having at least one alkoxy group bonded thereto.

The silane group or phosphorus-containing monomer may include a polyfunctional monomer having at least two photocurable functional groups, preferably about 2 or 3 photocurable functional groups.

Specifically, the silane group or phosphorus-containing monomer may be represented by Formula 1:

<Formula 1>

(wherein $Z_1$ and $Z_2$ are each independently represented by one of Formulae 2 to 4:

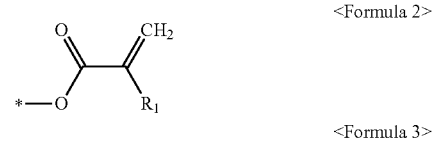

<Formula 2>

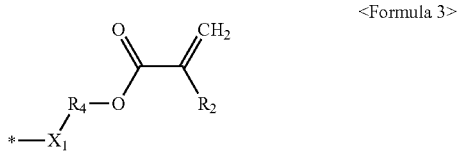

<Formula 3>

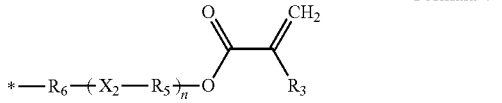

<Formula 4>

(wherein, in formulae 2 to 4, * is a binding site to carbon of W, $R_1$, $R_2$, and $R_3$ are each independently hydrogen or a $C_1$ to $C_5$ alkyl group, $R_4$, $R_5$, and $R_6$ are each independently a substituted or unsubstituted $C_1$ to $C_{20}$ alkylene group, or a substituted or unsubstituted C6 to C20 arylene group, $X_1$ and $X_2$ are each independently —O—, —S—, or —NR— (R being hydrogen, a substituted or unsubstituted $C_1$ to $C_{10}$ alkyl group, or a substituted or unsubstituted $C_6$ to $C_{20}$ aryl group), n is an integer from 0 to 20);

W is a substituted or unsubstituted $C_1$ to $C_{20}$ aliphatic hydrocarbon group, or a substituted or unsubstituted $C_6$ to $C_{20}$ aromatic hydrocarbon group;

$X_3$ is —O—, —S—, or —NR— (R being hydrogen, a substituted or unsubstituted $C_1$ to $C_{10}$ alkyl group, or a substituted or unsubstituted $C_6$ to $C_{20}$ aryl group);

Y is Formula 5 or 6:

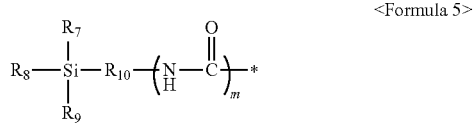

<Formula 5>

(wherein in formula 5, * is a binding site to $X_3$, $R_7$, $R_8$, and $R_9$ are each independently hydrogen, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group, $R_{10}$ is a substituted or unsubstituted $C_1$ to $C_{10}$ alkylene group or a substituted or unsubstituted $C_6$ to $C_{20}$ arylene group, and m is 0 or 1);

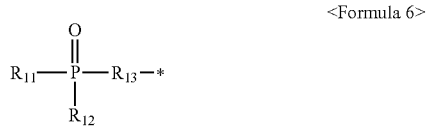

<Formula 6>

(wherein in formula 6, * is a binding site to $X_3$, $R_{11}$ and $R_{12}$ are each independently a hydroxyl group, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group, and $R_{13}$ is a substituted or unsubstituted $C_1$ to $C_{10}$ alkylene group, a substituted or unsubstituted $C_6$ to $C_{20}$ arylene group or a single bond); and p is an integer from 1 to 3).

In some embodiments, W may be a substituted or unsubstituted $C_1$ to $C_{20}$ alkylene group, a substituted or unsubstituted $C_1$ to $C_{20}$ alkyl group, a substituted or unsubstituted $C_6$ to $C_{20}$ arylene group, or a substituted or unsubstituted $C_6$ to $C_{20}$ arylene group; and $X_3$ may be coupled to carbon of Y and W. $X_3$ coupled to W may be coupled to any carbon of W.

In some embodiments, at least one of $R_7$, $R_8$, and $R_9$ may be a substituted or unsubstituted $C_1$ to $C_{10}$ alkoxy group.

In some embodiments, at least one of $R_{11}$ and $R_{12}$ may be a substituted or unsubstituted $C_1$ to $C_{10}$ alkoxy group.

The silane group or phosphorus-containing monomer may be prepared by any typical methods, or may be a commercially available product.

The silane group or phosphorus-containing monomer included together with the photocurable monomer in the photocurable composition can realize a layer having significantly lower water vapor permeability and outgassing after curing, and can increase photocuring rate. Further, the silane group or phosphorus-containing monomer can secure high adhesion of an organic barrier layer to an inorganic barrier layer in a typical encapsulation structure in which the organic barrier layer is stacked on the inorganic barrier layer.

In the photocurable composition, the silane group or phosphorus-containing monomer may be present in an amount of about 1 part by weight to 99 parts by weight based on 100 parts by weight of (A)+(B) in terms of solid content. Preferably, the silane group or phosphorus-containing monomer is present in an amount of about 5 parts by weight to about 80 parts by weight, more preferably about 5 parts by weight to about 70 parts by weight, still more preferably about 20 parts by weight to about 30 parts by weight, specifically about 20, 21, 22, 23, 24, 25, 26, 27, 28, 29, or 30 parts by weight. Within this range of the silane group or phosphorus-containing monomer, the photocurable composition can enhance adhesion to the inorganic barrier layer.

The photocurable composition may further include an initiator.

(C) Initiator

The initiator may include a photopolymerization initiator. The photopolymerization initiator may include any typical photopolymerization initiators capable of performing photocuring reaction in the art.

For example, the photopolymerization initiator may include triazine, acetophenone, benzophenone, thioxanthone, benzoin, phosphorus, oxime initiators, and mixtures thereof.

Examples of the triazine initiators may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl(piperonyl)-6-triazine, 2,4-(trichloromethyl(4'-methoxy styryl)-6-triazine, and mixtures thereof.

Examples of the acetophenone initiators may include 2,2'-diethoxyacetophenone, 2,2'-dibutoxyacetophenone, 2-hydroxy-2-methyl propiophenone, p-t-butyl trichloroacetophenone, p-t-butyl dichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and mixtures thereof.

Examples of the benzophenone initiators may include benzophenone, benzoyl benzoate, methyl benzoylbenzoate, 4-phenyl benzophenone, hydroxybenzophenone, acrylated benzophenone, 4,4'-bis(dimethyl amino)benzophenone, 4,4'-dichlorobenzophenone, 3,3'-dimethyl-2-methoxybenzophenone, and mixtures thereof.

Examples of the thioxanthone initiators may include thioxanthone, 2-methyl thioxanthone, isopropyl thioxanthone, 2,4-diethylthioxanthone, 2,4-diisopropylthioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphorus initiators may include bisbenzoylphenyl phosphine oxide, benzoyl(diphenyl) phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof The initiator may be present in an amount of about 0.1 parts by weight to about 20 part by weight, preferably about 0.5 parts by weight to about 10 parts by weight based on 100 parts by weight of (A)+(B) in terms of solid content. Within this range of the initiator, the photocurable composition allows sufficient photopolymerization and can prevent deterioration in transmittance due to unreacted initiator remaining after photopolymerization.

The photocurable composition may include about 1 part by weight to about 98 parts by weight of (A), about 1 part by weight to about 98 parts by weight of (B), about 0.1 parts by weight to about 10 parts by weight of (C), based on 100 parts by weight of solid content. Preferably, the photocurable composition may include about 50 parts by weight to about 80 parts by weight of (A), specifically about 50, 55, 60, 65, 70, 75, or 80 parts by weight; about 10 parts by weight to about 40 parts by weight of (B), specifically about 10, 15, 20, 25, 30, 35, or 40 parts by weight; and about 1 part by weight to about 10 parts by weight of (C), specifically about 1, 2, 3, 4, 5, 6, 7, 8, 9, or 10 parts by weight. Within this range, the photocurable composition can exhibit significantly lower outgassing and high curing rate, and can realize an organic barrier layer exhibiting high adhesion to an inorganic barrier layer.

The photocurable composition may be prepared by mixing the photocurable monomer and the monomer of Formula 1 or the oligomer thereof, or by further adding the initiator to the mixture. Preferably, the photocurable composition is formed as a solvent-free photocurable composition.

The photocurable composition may have a photocuring rate of about 90% to 100%, preferably about 94.7% to 100%. Within this range, the photocurable composition can realize a layer which does not suffer from a shift by virtue of low shrinkage stress after curing and thus can be used for encapsulation of a device.

A member for an apparatus, particularly a member for displays, can suffer from degradation or deterioration in quality due to permeation of gas or liquid in a surrounding environment, for example, atmospheric oxygen, moisture and/or water vapor, and due to permeation of chemicals used in the preparation of electronic products. To prevent this problem, the member for an apparatus needs to be sealed or encapsulated.

Examples of the member for an apparatus may include organic light emitting diodes (OLEDs), illumination devices, flexible organic light emitting devices, metal sensor pads, microdisc lasers, electrochromic devices, photochromic devices, microelectromechanical systems, solar cells, integrated circuits, charge coupled devices, light emitting polymers, and light emitting diodes, without being limited thereto.

The photocurable composition according to the present invention may form an organic barrier layer used for sealing or encapsulation of the member for an apparatus, particularly, an organic light emitting diode or a flexible organic light emitting diode.

In accordance with another aspect of the present invention, a barrier layer is an organic barrier layer and may have a water vapor permeability of 4.0 g/m$^2$·24 hr or less, as measured on a 5 μm thick coating under conditions of 37.8° C. and 100% RH for 24 hours. Within this range, the organic barrier layer can be used for encapsulation of a member for an apparatus. The organic barrier layer preferably has a water vapor permeability of 1.0 to 4.0 g/m$^2$·24 hr, more preferably 1.2 to 3.6 g/m$^2$·24 hr.

In accordance with a further aspect of the present invention, a barrier layer is an organic barrier layer and may have an outgassing amount of about 0 to about 1000 ppm. Within this range, the barrier layer can have insignificant adverse effect on a member for an apparatus and extend lifespan of the member for the apparatus. For example, the barrier layer may have an outgassing amount of about 0 or more to about 300 ppm or less. For example, the barrier layer may have an outgassing amount of about 10 ppm to about 200 ppm.

In accordance with yet another aspect of the present invention, a barrier layer is an organic barrier layer and may have an adhesive strength to an inorganic barrier layer of about 20 kgf/(mm)$^2$ or more. If the adhesive strength is less than 20 kgf/(mm)$^2$, external moisture or oxygen can easily permeate between the barrier layers, thereby causing deterioration in reliability. The inorganic barrier layer may include an inorganic barrier layer described below (for example, silicon oxides including $SiO_x$ and the like, silicon nitrides including $SiN_x$ and the like, and $Al_2O_3$), without being limited thereto. The organic barrier layer preferably has an adhesive strength to the inorganic barrier layer of about 20 kgf/(mm)$^2$ to about 100 kgf/(mm)$^2$, more preferably about 20 kgf/(mm)$^2$ to about 50 kgf/(mm)$^2$.

The organic barrier layer may include a cured product of the photocurable composition as set forth above.

In some embodiments, the barrier layer may be formed by photocuring the photocurable composition. The barrier layer may be formed by coating the photocurable composition to a thickness of about 0.1 μm to about 20 μm, preferably about 1 μm to about 10 μm, followed by irradiation at about 10 mW/cm$^2$ to about 500 mW/cm$^2$ for 1 second to 50 seconds.

Since the organic barrier layer has a water vapor permeability and an outgassing amount in the ranges as set forth above, the organic barrier layer and an inorganic barrier layer described below can form a barrier stack for encapsulation of the member for an apparatus.

In accordance with yet another aspect of the present invention, a barrier stack may include the organic barrier layer and the inorganic barrier layer.

The inorganic barrier layer includes different components from those of the organic barrier layer, thereby supplementing the effects of the organic barrier layer.

The inorganic barrier layer may be any inorganic barrier layer so long as the inorganic barrier layer can exhibit excellent light transmittance and excellent moisture and/or oxygen barrier properties.

For example, the inorganic barrier layer may be formed of metals, nonmetals, compounds thereof, alloys thereof, oxides thereof, fluorides thereof, nitrides thereof, carbides thereof, oxynitrides thereof, borides thereof, oxyborides thereof, silicides thereof, or mixtures thereof.

In some embodiments, the metals or the nonmetals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto.

Specifically, the inorganic barrier layer may be formed of silicon oxides, silicon nitrides, silicon oxynitrides, ZnSe, ZnO, $Sb_2O_3$, $Al_2O_3$, $In_2O_3$, or $SnO_2$.

The organic barrier layer can secure the water vapor permeability and outgassing amount as set forth above. As a result, when the organic and inorganic barrier layers are alternately deposited, the organic barrier layer can secure smoothness of the inorganic barrier layer. In addition, the organic barrier layer can prevent defects of one inorganic barrier layer from spreading to other inorganic barrier layers.

The organic barrier layer may include a cured product of the photocurable composition.

The barrier stack may include any number of organic and inorganic barrier layers. Combination of the organic and inorganic barrier layers may vary with a level of permeation resistance to oxygen, moisture, water vapor and/or chemicals.

In the barrier stack, the organic and inorganic barrier layers may be alternately deposited. Thereby, the inorganic barrier layer prepared from photocurable composition has the above mentioned properties of the photocurable composition. Accordingly, the organic barrier layer can supplement or reinforce encapsulation of an apparatus by the inorganic barrier layer.

Preferably, the organic and inorganic layers may be alternately formed in two or more layers, respectively. In addition, the organic and inorganic layers may be formed in a total of 10 layers or less (for example, about 2 layers to 10 layers), for example, in a total of 7 layers or less (for example, about 2 layers to 7 layers).

In the barrier stack, each organic barrier layer may have a thickness of about 0.1 μm to about 20 μm, preferably about 1 μm to about 10 μm, and each inorganic barrier layer may have a thickness of about 5 nm to about 500 nm, preferably about 5 nm to about 50 nm.

The barrier stack is a thin encapsulating film and may have an encapsulation thickness of about more than 0 to about 5 μm or less, for example, about 1.5 μm to about 5 μm.

The inorganic barrier layer may be formed by a vacuum process, for example, sputtering, chemical vapor deposition, plasma chemical vapor deposition, evaporation, sublimation, electron cyclotron resonance-plasma enhanced chemical vapor deposition, or combinations thereof.

The organic barrier layer may be deposited using the same method as in the inorganic barrier layer, or may be formed by coating the photocurable composition, followed by curing.

In accordance with yet aspect of the present invention, an encapsulated apparatus may include a member for the apparatus and a barrier stack formed on the member for the apparatus and including an inorganic barrier layer and an organic barrier layer.

In some embodiments, the organic barrier layer may have a water vapor permeability of 4.0 g/m²·24 hr or less, as measured on a 5 μm thick coating under conditions of 37.8° C. and 100% RH for 24 hours.

In other embodiments, the organic barrier layer may have an outgassing amount of about 0 or more to about 200 ppm or less.

In other embodiments, the organic barrier layer may have an adhesive strength to the inorganic barrier layer of about 20 kgf/(mm)² or more.

The organic barrier layer may include a cured product of the photocurable composition.

The organic barrier layer may refer to an encapsulation layer protecting the member for the apparatus including organic light emitting diodes, organic solar cells, and the like. The organic barrier layer can prevent the member for the apparatus from suffering from degradation or oxidation due to moisture, oxygen, and the like in a surrounding environment. In addition, the organic barrier layer exhibits considerably low outgassing even under high-humidity or high-temperature and high-humidity conditions, and thus minimizes effects of outgassing on the member for the apparatus, thereby preventing performance deterioration and reduction in lifespan of the member for the apparatus.

The organic barrier layer may be formed on an upper or lower side of the inorganic barrier layer.

The inorganic barrier layer may refer to an encapsulation layer protecting the member for the apparatus including organic light emitting diodes, organic solar cells, and the like. The inorganic barrier layer may adjoin the member for the apparatus to encapsulate a device, or may encapsulate an internal space containing the member for the apparatus without adjoining the member for the apparatus. The inorganic barrier layer can interrupt contact between external oxygen or moisture and the device, thereby preventing degradation or damage of the member for the apparatus.

The inorganic barrier layer may be formed on an upper side of the member for the apparatus, an upper side of the organic barrier layer, or a lower side of the organic barrier layer.

The encapsulated apparatus include a device encapsulated by the inorganic and organic barrier layers exhibiting different properties. At least one of the inorganic and organic barrier layers may be coupled to a substrate to encapsulate the device.

Each of the inorganic and organic barrier layers may be included in multiple layers such as two layers or more in the encapsulated apparatus. In one embodiment, the inorganic and organic barrier layers may be alternately deposited, for example, in order of inorganic barrier layer/organic barrier layer/inorganic barrier layer/organic barrier layer. Preferably, the inorganic and organic barrier layers are included in a total of 10 layers or less (for example, about 2 layers to 10 layers), more preferably in a total of 7 layers or less (for example, about 2 layers to 7 layers).

Details of the organic and inorganic barrier layers are as described above.

The encapsulated apparatus may include a substrate depending upon the kind of the member for the apparatus.

The substrate is not particularly limited so long as the member for the apparatus can be stacked on the substrate. For example, the substrate may be formed of a material such as transparent glass, a plastic sheet, silicon, or metal.

FIG. 1 is a sectional view of an encapsulated apparatus according to one embodiment of the present invention. Referring to FIG. 1, the encapsulated apparatus 100 includes a substrate 10, a member for the apparatus 20 formed on the substrate 10, and a barrier stack formed on the member for the apparatus 20 and including an inorganic barrier layer 31 and an organic barrier layer 32, wherein the inorganic barrier layer 31 adjoins the member for the apparatus 20.

FIG. 2 is a sectional view of an encapsulated apparatus according to another embodiment of the present invention. Referring to FIG. 2, the encapsulated apparatus 200 includes a substrate 10, a member for the apparatus 20 formed on the substrate 10, and a barrier stack 30 formed on the member for the apparatus 20 and including an inorganic barrier layer 31 and an organic barrier layer 32, wherein the inorganic barrier layer 31 may seal an internal space 40 containing the member for the apparatus 20.

Although each of the inorganic and organic barrier layers is illustrated as being formed as a single layer in FIGS. 1 and 2, each of the inorganic and organic barrier layers may be composed of multiple layers. In addition, the apparatus may further include a sealant and/or a substrate on a lateral side and/or an upper side of the complex barrier layer composed of the inorganic and organic barrier layers (not shown in FIGS. 1 and 2).

The encapsulated apparatus may be prepared by any typical method. The member for the apparatus is formed on the substrate, followed by forming the inorganic barrier layer on the member for the apparatus. The photocurable composition is coated to a thickness of 1 μm to 5 μm by spin coating, slit coating, or the like, followed by irradiation to form the organic barrier layer. The procedure of forming the inorganic and organic barrier layers may be repeated (preferably 10 times or less).

In some embodiments, the encapsulated apparatus may include an organic electroluminescent display including an organic light emitting diode, a display such as a liquid crystal display, a solar cell, and the like, without being limited thereto.

MODE FOR INVENTION

Hereinafter, the present invention will be described in more detail with reference to some examples. However, it should be understood that these examples are provided for illustration only and are not to be in any way construed as limiting the present invention.

[Preparative Example 1] [Preparation of Compound of Formula 7]

In a 500 ml flask provided with a cooling tube and a stirrer, 50 g of glycidyl methacrylate (Aldrich GmbH), 41 g of 2-hydroxyethyl acrylate, and 1 g of triphenyl phosphine were placed and stirred at 100° C. for 6 hours, followed by cooling, thereby obtaining 75 g of a compound represented by Formula 7 and having a GC purity of 96% through silica gel column chromatography.

<Formula 7>

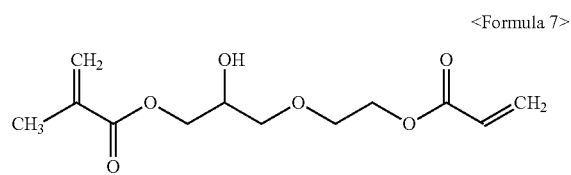 [SMILES: C=CC(=O)OCCOCC(O)COC(=O)C(=C)C]

[Preparative Example 2] [Preparation of Compound of Formula 8]

In a 500 ml flask provided with a cooling tube and a stirrer, 50 g of glycidyl methacrylate (Aldrich GmbH), 46 g of 2-hydroxyethyl methacrylate (Aldrich GmbH), and 1 g of triphenyl phosphine (Aldrich GmbH) were placed and stirred at 100° C. for 6 hours, followed by cooling, thereby obtaining 78 g of a compound represented by Formula 8 and having a GC purity of 95% through silica gel column chromatography.

<Formula 8>

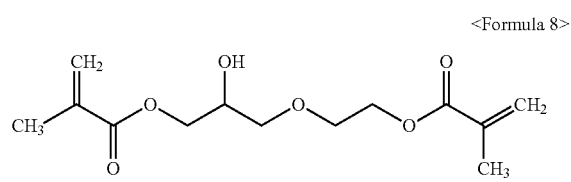 [SMILES: C=C(C)C(=O)OCCOCC(O)COC(=O)C(=C)C]

[Preparative Example 3] [Preparation of Compound of Formula 9]

In a 500 ml flask provided with a cooling tube and a stirrer, 50 g of glycidyl methacrylate (Aldrich GmbH), 26 g of acrylic acid (Aldrich GmbH), and 1 g of triphenyl phosphine (Aldrich GmbH) were placed and stirred at 100° C. for 6 hours, followed by cooling, thereby obtaining 81 g of a compound represented by Formula 9 and having a GC purity of 98% through silica gel column chromatography.

<Formula 9>

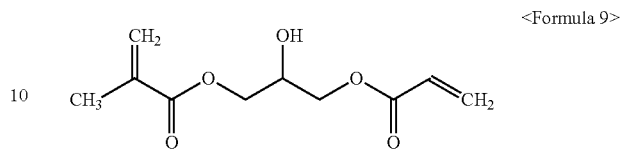

[Preparative Example 4] [Preparation of Compound of Formula 10]

In a 500 ml flask provided with a cooling tube and a stirrer, 50 g of glycidyl methacrylate (Aldrich GmbH), 31 g of methacrylic acid (Aldrich GmbH), and 1 g of triphenyl phosphine (Aldrich GmbH) were placed and stirred at 100° C. for 6 hours, followed by cooling, thereby obtaining 79 g of a compound represented by Formula 10 and having a GC purity of 98% through silica gel column chromatography.

<Formula 10>

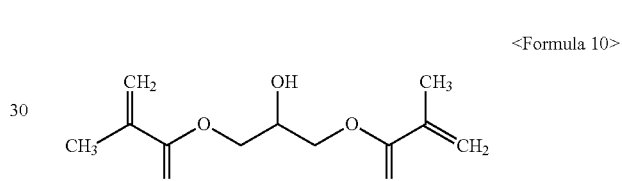

[Preparative Example 5] [Preparation of Compound of Formula 11]

In a 500 ml flask provided with a cooling tube and a stirrer, 50 g of glycidyl methacrylate (Aldrich GmbH), 51 g of 4-hydroxybutyl acrylate (LG Chemical Co., Ltd.), and 1 g of triphenyl phosphine (Aldrich GmbH) were placed and stirred at 100° C. for 6 hours, followed by cooling, thereby obtaining 79 g of a compound represented by Formula 11 and having a GC purity of 94% through silica gel column chromatography.

<Formula 11>

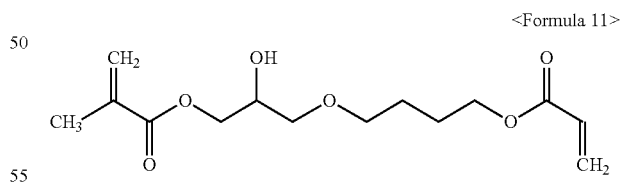

[Preparative Example 6] [Preparation of Compound of Formula 12]

In a 500 ml flask provided with a cooling tube and a stirrer, 50 g of diethyl(hydroxymethyl)phosphonate (Acros Organics Co., Ltd.), 50.5 g of trifluoromethyl sulfonyl chloride (Aldrich GmbH), and 250 ml of ethyl acetate were placed and heated to 50° C., and then 31 g of trimethylamine (Aldrich GmbH) was added dropwise to the mixture for 30 minutes, followed by stirring at 70° C. for 5 hours and cooling, thereby obtaining 79 g of a compound represented by Formula 12 and having a GC purity of 97% through silica gel column chromatography. Here, ethyl acetate was removed by vacuum distillation.

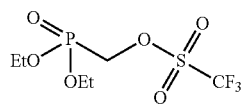

<Formula 12>

[Preparative Examples 7 to 9] [Preparation of Compounds of Formulae 13, 14, 15]

In a 500 ml flask provided with a cooling tube and a stirrer, 250 ml of ethyl acetate, KBE-9007 (3-isocyanatepropyltriethoxysilane, Shin-Etsu Co., Ltd.), and the compounds of Formulae 7, 8, 9 were placed in amounts as listed in Table 1, followed by reaction at 50° C. for 4 hours, thereby obtaining compounds represented by the following Formulae 13, 14, and 15 through silica gel column chromatography. Here, ethyl acetate was removed by vacuum distillation.

TABLE 1

| | Reactant 1 | Reactant 2 | Resulting compound | Resulting compound GC purity (%) | Resulting compound weight (g) |
|---|---|---|---|---|---|
| Preparative Example 7 | Formula 7 (50 g) | KBE-9007 (48 g) | Formula 13 | 93 | 85 |
| Preparative Example 8 | Formula 8 (50 g) | KBE-9007 (46 g) | Formula 14 | 93 | 89 |
| Preparative Example 9 | Formula 9 (50 g) | KBE-9007 (58 g) | Formula 15 | 94 | 97 |

<Formula 13>

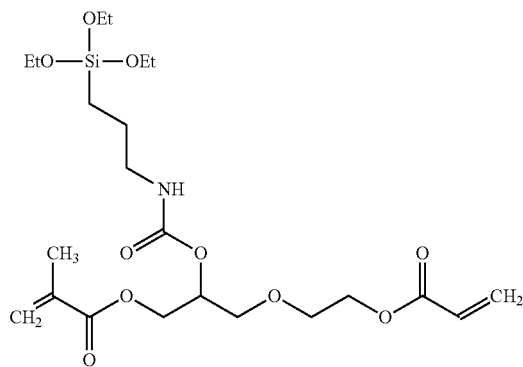

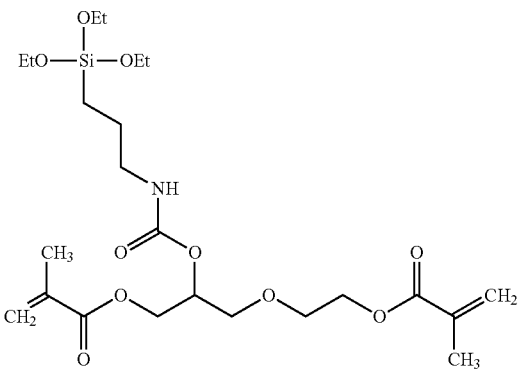

<Formula 14>

<Formula 15>

(In Formulae 13, 14 and 14, Et is an ethyl group)

[Preparative Example 10 to 12] [Preparation of Compounds of Formulae 16, 17 and 18]

In a 500 ml flask provided with a cooling tube and a stirrer, 250 ml of acetone and 96 g of potassium carbonate anhydride were placed, and the compound of Formula 12 prepared in Preparative Example 6 and the compounds of Formulae 9, 10 and 11 were added in amounts as listed in Table 2, reacted at 60° C. for 12 hours, followed by removing salts through filtering and acetone through vacuum distillation, thereby obtaining resulting compounds of Formulae 16, 17 and 18 through silica gel column chromatography.

TABLE 2

| | Reactant 3 | Reactant 4 | Resulting Compound | Resulting Compound GC purity (%) | Resulting Compound Weight (g) |
|---|---|---|---|---|---|
| Preparative Example 10 | Formula 9 (50 g) | Formula 12 (70 g) | Formula 16 | 91 | 56 |
| Preparative Example 11 | Formula 10 (50 g) | Formula 12 (66 g) | Formula 17 | 90 | 51 |
| Preparative Example 12 | Formula 11 (50 g) | Formula 12 (53 g) | Formula 18 | 91 | 43 |

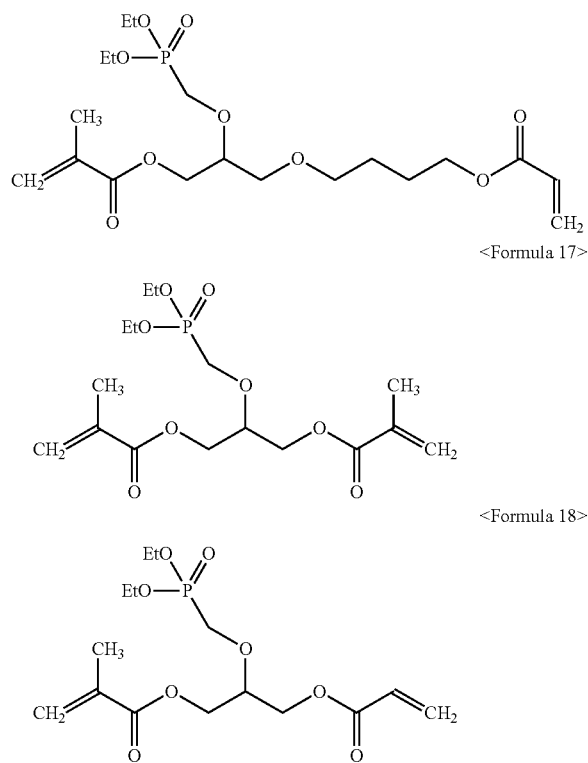

<Formula 16>

<Formula 17>

<Formula 18>

(in Formulae 16 to 18, Et is an ethyl group)

Detailed components used in the following examples and comparative examples were as follows.

(A) Photocurable monomer: (A1) hexyl acrylate, (A2) hexanediol diacrylate, (A3) pentaerythritol tetraacrylate (Aldrich GmbH)

(B) Silane group or phosphorus-containing monomer: (B1) the compound of Preparative Example 7 (Formula 13), (B2) the compound of Preparative Example 8 (Formula 14), (B3) the compound of Preparative Example 9 (Formula 15), (B4) the compound of Preparative Example 10 (Formula 16), (B5) the compound of Preparative Example 11 (Formula 17), (B6) the compound of Preparative Example 12 (Formula 18)

(C) Initiator: Darocur TPO (BASF GmbH)

(b): (b1) the compound of Preparative Example 1 (Formula 7), (b2) the compound of Preparative Example 2 (Formula 8), (b3) the compound of Preparative Example 3 (Formula 9), (b4) the compound of Preparative Example 4 (Formula 10), (b5) the compound of Preparative Example 5 (Formula 11)

Examples 1 to 6 and Comparative Examples 1 to 6

Each of compositions was prepared by placing the (A) photocurable monomer, the (B) silane group or phosphorus-containing monomer, the (C) initiator, and the (b) monomer in amounts as listed in Table 4 (unit: parts by weight) in a 125 ml brown polypropylene bottle, followed by stirring for 3 hours using a shaker.

Each of the compositions prepared in Examples and Comparative Examples was evaluated as to the following properties. Results are shown in Table 4.

Evaluation of Properties

1. Outgassing amount (ppm): The photocurable composition was spray-coated onto a glass substrate, followed by UV curing through UV irradiation at 100 mW/cm$^2$, thereby obtaining an organic barrier layer specimen having a size of 20 cm×20 cm×3 μm (width×length×thickness). Outgassing amount was measured on the specimen using a GC/MS tester (Perkin Elmer Clarus 600). GC/MS utilized a DB-5MS column (length: 30 m, diameter: 0.25 mm, thickness of stationary phase: 0.25 μm) as a column, and helium gas (flow rate: 1.0 mL/min, average velocity=32 cm/s) as a mobile phase. Further, the split ratio was 20:1, and the specimen was maintained at 40° C. for 3 minutes, heated at a rate of 10° C./min and then maintained at 320° C. for 6 minutes. Outgas was collected under the conditions that a glass size was 20 cm×20 cm, a collection container was a Tedlar bag, collection temperature was 90° C., collection time was 30 minutes, N$_2$ purging was performed at a flow rate of 300 mL/min, and Tenax GR (5% phenyl methyl polysiloxane) was used as an adsorbent. A calibration curve was plotted using a toluene solution in n-hexane in a concentration of 150 ppm, 400 ppm and 800 ppm as a standard solution, wherein R2 value was 0.9987. The above conditions are summarized in Table 3.

TABLE 3

| Conditions | Details |
| --- | --- |
| Collection conditions | Glass size: 20 cm × 20 cm |
| | Collection container: Tedlar bag |
| | Collection temperature: 90° C. |
| | Collection time: 30 min |
| | N2 purge flow rate: 300 mL/min |
| | Adsorbent: Tenax GR (5% phenylmethylpolysiloxane) |
| Conditions for plotting calibration curve | Standard solution: Toluene in n-hexane |
| | Concentration range (reference): 150 ppm, 400 ppm, 800 ppm |
| | R2: 0.9987 |
| GC/MS conditions Column | DB-5MS→30 m × 0.25 mm × 0.25 μm (5% phenyl methyl polysiloxane) |
| Mobile phase | He |
| Flow | 1.0 mL/min (Average velocity = 32 cm/s) |
| Split | Split ratio = 20:1 |
| Method | 40° C. (3 min) → 10° C./min → 320° C. (6 min) |

2. Photocuring rate (%): The photocurable composition was measured as to intensity of absorption peaks in the vicinity of 1635 cm$^{-1}$ (C=C) and 1720 cm$^{-1}$ (C=O) using an FT-IR spectrometer (NICOLET 4700, Thermo Co., Ltd.). The photocurable composition was spray-coated onto a glass substrate, followed by UV curing through UV irradiation at 100 J/cm$^2$ for 10 seconds, thereby obtaining a specimen having a size of 20 cm×20 cm×3 μm (width×length×thickness). Then, the cured film was aliquoted, and the intensity of absorption peaks of the cured film was measured in the vicinity of 1635 cm$^{-1}$ (C=C) and 1720 cm$^{-1}$ (C=O) using an FT-IR spectrometer (NICOLET 4700, Thermo Co., Ltd.). Photocuring rate was calculated by Equation 1:

$$\text{Photocuring rate (\%)}=|1-(A/B)|\times 100 \quad (1)$$

(wherein A is a ratio of the intensity of an absorption peak in the vicinity of 1635 cm$^{-1}$ to the intensity of an absorption peak in the vicinity of 1720 cm$^{-1}$ measured for the cured film, and B is a ratio of the intensity of an absorption peak in the vicinity of 1635 cm$^{-1}$ to the intensity of an absorption peak in the vicinity of 1720 cm$^{-1}$ measured for the photocurable composition).

3. Adhesive strength 1 (die shear strength, kgf/(mm)$^2$): 0.01 g of each of the photocurable compositions listed in Table 4 was coated onto a glass substrate having a size of 5 mm×5 mm×2 mm (width×length×height), and a glass substrate having a size of 20 mm×80 mm×2 mm (width×length×height) was stacked on the photocurable composition coating layer, followed by curing at 1000 J/cm² using a D-bulb light source. Then, die shear strength was measured twice using a Dage 4000 bond tester and compared.

4. Adhesive strength 2 (die shear strength, kgf/(mm)²): 0.01 g of each of the photocurable compositions listed in Table 4 was coated onto a glass substrate having a size of 5 mm×5 mm×2 mm (width×length×height) and having silicon nitride adsorbed onto a surface thereof, and a glass substrate having a size of 20 mm×80 mm×2 mm (width×length×height) and having silicon nitride adsorbed onto a surface thereof was stacked on the photocurable composition coating layer, followed by curing at 1000 J/cm² using a D-bulb light source. Then, die shear strength was measured twice using a Dage 4000 bond tester and compared.

TABLE 4

|   |   | Examples | | | | | | Comparative Examples | | | | | |
|---|---|---|---|---|---|---|---|---|---|---|---|---|---|
|   |   | 1 | 2 | 3 | 4 | 5 | 6 | 1 | 2 | 3 | 4 | 5 | 6 |
| A | A1 | 15 | 15 | 15 | 15 | 15 | 15 | 15 | 15 | 15 | 15 | 15 | 15 |
|   | A2 | 50 | 50 | 50 | 50 | 50 | 75 | 50 | 50 | 50 | 50 | 50 | 50 |
|   | A3 | 10 | 10 | 10 | 10 | 10 | 10 | 10 | 10 | 10 | 10 | 10 | 10 |
| B | B1 | 25 | — | — | — | — | — | — | — | — | — | — | — |
|   | B2 | — | 25 | — | — | — | — | — | — | — | — | — | — |
|   | B3 | — | — | 25 | — | — | — | — | — | — | — | — | — |
|   | B4 | — | — | — | 25 | — | — | — | — | — | — | — | — |
|   | B5 | — | — | — | — | 25 | — | — | — | — | — | — | — |
|   | B6 | — | — | — | — | — | 25 | — | — | — | — | — | — |
| b | b1 | — | — | — | — | — | — | — | 25 | — | — | — | — |
|   | b2 | — | — | — | — | — | — | — | — | 25 | — | — | — |
|   | b3 | — | — | — | — | — | — | — | — | — | 25 | — | — |
|   | b4 | — | — | — | — | — | — | — | — | — | — | 25 | — |
|   | b5 | — | — | — | — | — | — | — | — | — | — | — | 25 |
| C |   | 5 | 5 | 5 | 5 | 5 | 5 | 5 | 5 | 5 | 5 | 5 | 5 |
| Outgassing amount (ppm) |   | 130 | 140 | 120 | 150 | 120 | 110 | 345 | 125 | 180 | 200 | 250 | 330 |
| Photocuring rate (%) |   | 95.1 | 95.6 | 94.7 | 95.2 | 95.1 | 95.2 | 88.3 | 94.1 | 91.6 | 92.2 | 88.5 | 94.5 |
| Adhesive strength 1 (kgf/(mm)²) |   | 24.3 | 27.2 | 32.4 | 34.5 | 28.3 | 27.8 | 6.5 | 15.9 | 15.6 | 16.8 | 16.1 | 19.7 |
| Adhesive strength 2 (kgf/(mm)²) |   | 27.4 | 31.2 | 34.2 | 35.1 | 29.8 | 27.9 | 7.1 | 17.2 | 17.5 | 17.6 | 17.4 | 20.1 |

As shown in Table 4, it could be seen that the coating films formed of the photocurable compositions according to the present invention had the same level or were much lower than the coating films formed of the compositions prepared in Comparative Examples in terms of outgassing amount, and had a higher photocuring rate of up to about 7.3% than those of Comparative Examples. In addition, the coating films formed of the photocurable compositions according to the present invention exhibited much higher adhesion to silicon oxide and silicon nitride than those of Comparative Examples.

The invention claimed is:

1. A photocurable composition comprising:
    (A) a photocurable monomer, the photocurable monomer including one or more of a $C_1$ to $C_{20}$ alkyl group-containing (meth)acrylate, a $C_2$ to $C_{20}$ diol di(meth)acrylate, a $C_3$ to $C_{20}$ triol tri(meth)acrylate, or a $C_4$ to $C_{20}$ tetraol tetra(meth)acrylate;
    (B) a monomer represented by Formula 1 or an oligomer thereof, and
    (C) a photopolymerization initiator;

<Formula 1> wherein $Z_1$ and $Z_2$ are each independently represented by one of Formulae 2 to 4:

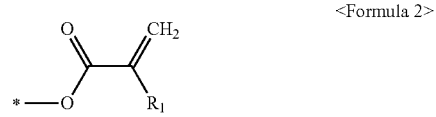
<Formula 2>

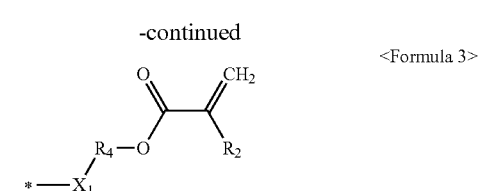
<Formula 3>

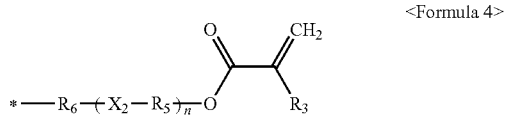
<Formula 4> wherein in formulae 2 to 4, * is a binding site to carbon of W; $R_1$, $R_2$, and $R_3$ are each independently hydrogen or a substituted or unsubstituted $C_1$ to $C_5$ alkyl group; $R_4$, $R_5$, and $R_6$ are each independently a substituted or unsubstituted $C_1$ to $C_{20}$ alkylene group, or a substituted or unsubstituted $C_6$ to $C_{20}$ arylene group; $X_1$ and $X_2$ are each independently —O—, —S—, or —NR—, in which R is hydrogen, a substituted or unsubstituted $C_1$ to $C_{10}$ alkyl group, or a substituted or unsubstituted $C_6$ to $C_{20}$ aryl group; n is an integer from 0 to 20;

W is a substituted or unsubstituted $C_1$ to $C_{20}$ aliphatic hydrocarbon group, or a substituted or unsubstituted $C_6$ to $C_{20}$ aromatic hydrocarbon group;

$X_3$ is —O—, —S—, or —NR—, in which R is hydrogen, a substituted or unsubstituted $C_1$ to $C_{10}$ alkyl group, or a substituted or unsubstituted $C_6$ to $C_{20}$ aryl group;

Y is Formula 5 or 6:

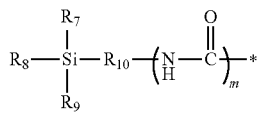

<Formula 5> wherein in formula 5, * is a binding site to $X_3$; $R_7$, $R_8$, and $R_9$ are each independently hydrogen, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group; $R_{10}$ is a substituted or unsubstituted $C_1$ to $C_{10}$ alkylene group or a substituted or unsubstituted $C_6$ to $C_{20}$ arylene group; and m is 1;

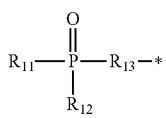

<Formula 6> wherein in formula 6, * is a binding site to $X_3$; $R_{11}$ and $R_{12}$ are each independently a hydroxyl group, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group; and $R_{13}$ is a substituted or unsubstituted $C_1$ to $C_{10}$ alkylene group, a substituted or unsubstituted $C_6$ to $C_{20}$ arylene group or a single bond;

p is an integer from 1 to 3, and the (A) photocurable monomer is present in an amount of about 50 parts by weight to about 90 parts by weight, and the (B) monomer represented by Formula 1 or an oligomer thereof is present in an amount of about 10 parts by weight to about 50 parts by weight, based on 100 parts by weight of the (A) photocurable monomer+the (B) monomer represented by Formula 1 or an oligomer thereof in terms of solid content.

2. The photocurable composition according to claim 1, wherein at least one of $R_7$, $R_8$, and $R_9$ is a substituted or unsubstituted $C_1$ to $C_{10}$ alkoxy group.

3. A photocurable composition comprising:
(A) a photocurable monomer;
(B) a monomer represented by Formula 1 or an oligomer thereof, and
(C) an initiator;

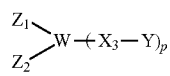

<Formula 1> wherein $Z_1$ and $Z_2$ are each independently represented by one of Formulae 2 to 4:

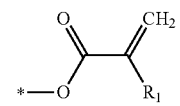

<Formula 2>

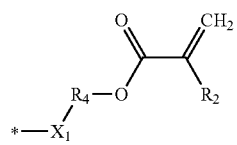

<Formula 3>

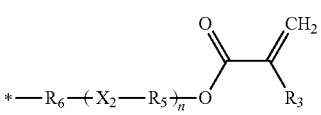

<Formula 4> wherein in formulae 2 to 4, * is a binding site to carbon of W; $R_1$, $R_2$, and $R_3$ are each independently hydrogen or a substituted or unsubstituted $C_1$ to $C_5$ alkyl group; $R_4$, $R_5$, and $R_6$ are each independently a substituted or unsubstituted $C_1$ to $C_{20}$ alkylene group, or a substituted or unsubstituted $C_6$ to $C_{20}$ arylene group; $X_1$ and $X_2$ are each independently —O—, —S—, or —NR—, in which R is hydrogen, a substituted or unsubstituted $C_1$ to $C_{10}$ alkyl group, or a substituted or unsubstituted $C_6$ to $C_{20}$ aryl group; n is an integer from 0 to 20;

W is a substituted or unsubstituted $C_1$ to $C_{20}$ aliphatic hydrocarbon group, or a substituted or unsubstituted $C_6$ to $C_{20}$ aromatic hydrocarbon group;

$X_3$ is —O—, —S—, or —NR—, in which R is hydrogen, a substituted or unsubstituted $C_1$ to $C_{10}$ alkyl group, or a substituted or unsubstituted $C_6$ to $C_{20}$ aryl group;

Y is Formula 5 or 6:

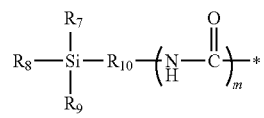

<Formula 5> wherein in formula 5, * is a binding site to $X_3$; $R_7$, $R_3$, and $R_9$ are each independently hydrogen, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group; $R_{10}$ is a substituted or unsubstituted $C_1$ to $C_{10}$ alkylene group or a substituted or unsubstituted $C_6$ to $C_{20}$ arylene group; and m is 1, provided that when Y is Formula 5 and $Z_1$ and $Z_2$ are represented by Formula 2, $R_1$ in one of $Z_1$ and $Z_2$ is hydrogen and $R_1$ in the other one of $Z_1$ and $Z_2$ is a substituted or unsubstituted $C_1$ to $C_5$ alkyl group;

<Formula 6>

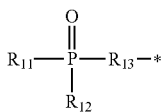

wherein in formula 6, * is a binding site to $X_3$; $R_{11}$ and $R_{12}$ are each independently a hydroxyl group, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group, wherein at least one of $R_{11}$ and $R_{12}$ is a substituted or unsubstituted $C_1$ to $C_{10}$ alkoxy group; and $R_{13}$ is a substituted or unsubstituted $C_1$ to $C_{10}$ alkylene group, a substituted or unsubstituted $C_6$ to $C_{20}$ arylene group or a single bond, and p is an integer from 1 to 3, the (A) photocurable monomer is present in an amount of about 50 parts by weight to about 90 parts by weight, and the (B) monomer represented by Formula 1 or an oligomer thereof is present in an amount of about 10 parts by weight to about 50 parts by weight, based on 100 parts by weight of the (A) photocurable monomer+the (B) monomer represented by Formula 1 or an oligomer thereof in terms of solid content.

4. The photocurable composition according to claim 1, wherein the monomer represented by Formula 1 is represented by one of Formulae 13 to 18:

<Formula 13>

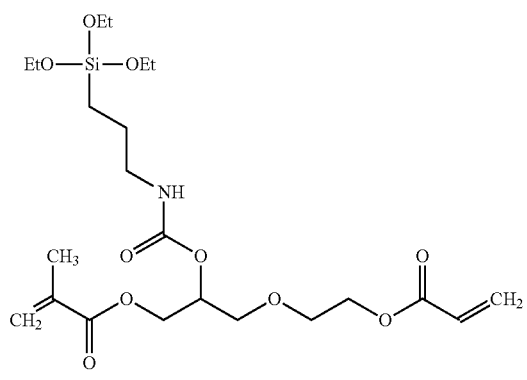

<Formula 14>

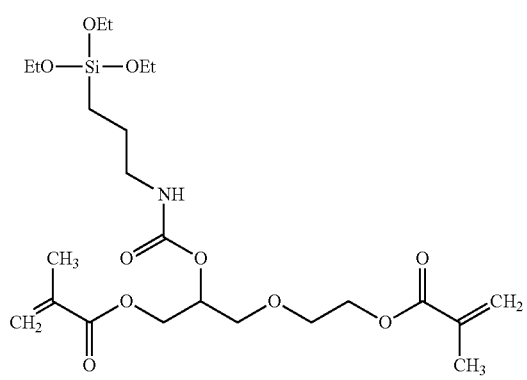

<Formula 15>

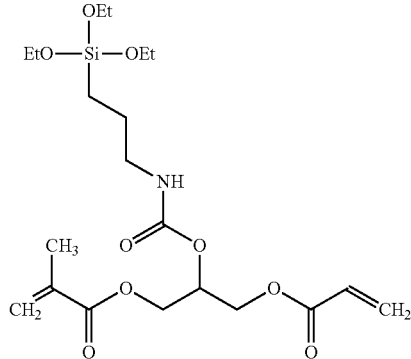

<Formula 16>

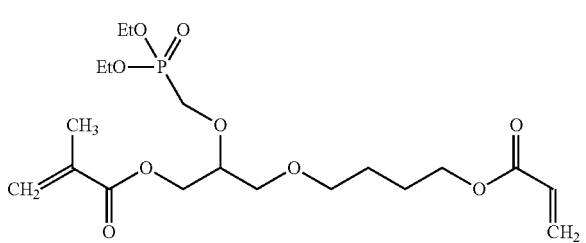

<Formula 17>

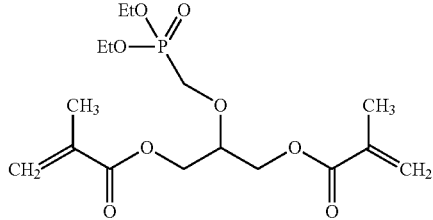

<Formula 18>

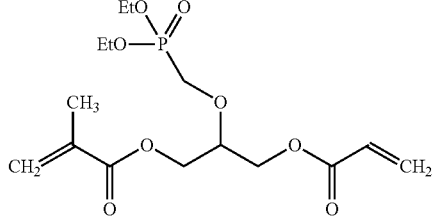

wherein in Formulae 16 to 18, Et is an ethyl group.

5. The photocurable composition according to claim 1, wherein the (A) photocurable monomer includes a monomer having 1 to 30 of substituted or unsubstituted vinyl groups, 1 to 30 substituted or unsubstituted acrylate groups, or 1 to 30 substituted or unsubstituted methacrylate groups.

6. An encapsulated apparatus comprising:
a member for the apparatus; and
a barrier stack formed on the member for the apparatus and including an inorganic barrier layer and an organic barrier layer,
wherein the organic barrier layer includes a cured product of a photocurable composition, the photocurable composition including:
(A) a photocurable monomer, wherein the photocurable monomer includes one or more of a $C_1$ to $C_{20}$ alkyl group-containing (meth)acrylate, a $C_2$ to $C_{20}$ diol di(meth)acrylate, a $C_3$ to $C_{20}$ triol tri(meth)acrylate, or a $C_4$ to $C_{20}$ tetraol tetra(meth)acrylate;
(B) a monomer represented by Formula 1 or an oligomer thereof, and (C) an initiator;

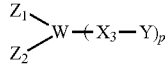
<Formula 1> wherein $Z_1$ and $Z_2$ are each independently represented by one of Formulae 2 to 4:

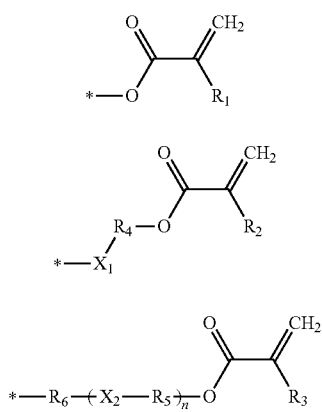

wherein in formulae 2 to 4, * is a binding site to carbon of W; $R_1$, $R_2$, and $R_3$ are each independently hydrogen or a substituted or unsubstituted $C_1$ to $C_5$ alkyl group; $R_4$, $R_5$, and $R_6$ are each independently a substituted or unsubstituted $C_1$ to $C_{20}$ alkylene group, or a substituted or unsubstituted $C_6$ to $C_{20}$ arylene group; $X_1$ and $X_2$ are each independently —O—, —S—, or —NR—, in which R is hydrogen, a substituted or unsubstituted $C_1$ to $C_{10}$ alkyl group, or a substituted or unsubstituted $C_6$ to $C_{20}$ aryl group; n is an integer from 0 to 20;

W is a substituted or unsubstituted $C_1$ to $C_{20}$ aliphatic hydrocarbon group, or a substituted or unsubstituted $C_6$ to $C_{20}$ aromatic hydrocarbon group;

$X_3$ is —O—, —S—, or —NR—, in which R is hydrogen, a substituted or unsubstituted $C_1$ to $C_{10}$ alkyl group, or a substituted or unsubstituted $C_6$ to $C_{20}$ aryl group;

Y is Formula 5 or 6:

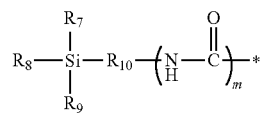
<Formula 5> wherein in formula 5, * is a binding site to $X_3$; $R_7$, $R_8$, and $R_9$ are each independently hydrogen, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group; $R_{10}$ is a substituted or unsubstituted $C_1$ to $C_{10}$ alkylene group or a substituted or unsubstituted $C_6$ to $C_{20}$ arylene group; and m is 1;

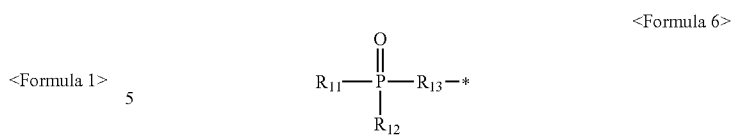
<Formula 6> wherein in formula 6, * is a binding site to $X_3$; $R_{11}$ and $R_{12}$ are each independently a hydroxyl group, a substituted or unsubstituted $C_1$ to $C_{10}$ alkoxy group, a substituted or unsubstituted $C_1$ to $C_{10}$ alkyl group, or a substituted or unsubstituted $C_6$ to $C_{20}$ aryl group; and $R_{13}$ is a substituted or unsubstituted $C_1$ to $C_{10}$ alkylene group, a substituted or unsubstituted $C_6$ to $C_{20}$ arylene group or a single bond; and p is an integer from 1 to 3, the (A) photocurable monomer is present in an amount of about 50 parts by weight to about 90 parts by weight, and the (B) monomer represented by Formula 1 or an oligomer thereof is present in an amount of about 10 parts by weight to about 50 parts by weight, based on 100 parts by weight of the (A) photocurable monomer+the (B) monomer represented by Formula 1 or an oligomer thereof in terms of solid content.

7. The encapsulated apparatus according to claim 6, wherein the organic barrier layer has an outgassing amount of about 0 or more to 300 ppm or less.

8. The encapsulated apparatus according to claim 6, wherein the organic barrier layer has an adhesive strength to the inorganic barrier layer of about 20 kgf/(mm)² or more.

9. The encapsulated apparatus according to claim 6, wherein the inorganic barrier layer includes a metal, a nonmetal, a compound thereof, an alloy thereof, an oxide thereof, a fluoride thereof, a nitride thereof, a carbide thereof, an oxynitride thereof, a boride thereof, an oxyboride thereof, a silicide thereof, or a mixture thereof, and the metal or the nonmetal includes one or more of silicon (Si), aluminum (Al), selenium (Se), zinc (Zn), antimony (Sb), indium (In), germanium (Ge), tin (Sn), bismuth (Bi), a transition metal, or a lanthanide metal.

10. The encapsulated apparatus according to claim 6, wherein the barrier stack includes the organic barrier layer and the inorganic barrier layer alternately stacked one above another.

11. The encapsulated apparatus according to claim 6, wherein the barrier stack includes the organic barrier layer and the inorganic barrier layer in a total of about 2 layers or more to 10 layers or less.

12. The encapsulated apparatus according to claim 6, wherein the organic barrier layer has a thickness of about 0.1 µm to about 20 µm and the inorganic barrier layer has a thickness of about 5 nm to about 500 nm.

13. The encapsulated apparatus according to claim 6, wherein the member for the apparatus includes a organic light emitting device, a metal sensor pad, a microdisc laser, an electrochromic device, a photochromic device, a microelectromechanical system, a solar cell, an integrated circuit, or a charge coupled device.

14. The encapsulated apparatus according to claim 6, wherein the member for the apparatus includes a flexible organic light emitting device.

15. The encapsulated apparatus according to claim 6, wherein the member for the apparatus includes an illumination device.

16. The encapsulated apparatus according to claim 6, wherein the member for the apparatus includes a light-emitting polymer.

17. The encapsulated apparatus according to claim 6, wherein the member for the apparatus includes a light-emitting diode.

\* \* \* \* \*